United States Patent [19]

Gonda

[11] 4,360,867

[45] Nov. 23, 1982

[54] BROADBAND FREQUENCY MULTIPLICATION BY MULTITRANSITION OPERATION OF STEP RECOVERY DIODE

[75] Inventor: Joseph Gonda, Moultonboro, N.H.

[73] Assignee: Bell Telephone Laboratories, Incorporated, Murray Hill, N.J.

[21] Appl. No.: 213,935

[22] Filed: Dec. 8, 1980

[51] Int. Cl.³ .................. H03B 19/20; H02M 5/20
[52] U.S. Cl. .................................. 363/158; 333/246
[58] Field of Search ................. 333/246; 363/157–159

[56] References Cited

U.S. PATENT DOCUMENTS 3,374,416  3/1968  Hall et al. ......................... 363/158

FOREIGN PATENT DOCUMENTS 1541668  9/1969  Fed. Rep. of Germany ...... 363/158
1180484  2/1970  United Kingdom ................ 363/158

OTHER PUBLICATIONS

Hall, "Harmonic Generators: is the Step Recovery Diode Best?", Electronic Design, Jan. 18, 1965, pp. 28–30, 32, 33.

Chilvers et al., "Simulation of a High Order, Charge-Storage-Diode Multiplier on an Analogue Computer", Electronics Letters, vol. 3, No. 6, Jun. 1967, pp. 277, 278.

Primary Examiner—A. D. Pellinen
Attorney, Agent, or Firm—John Francis Moran

[57] ABSTRACT

A frequency multiplier which employs a step recovery diode operated in a double pulse mode for each period of the cycle of the input frequency signal provides efficient and high order harmonic generation. The bias circuitry for the diode and impedance characteristics of the input and output bandpass filters are selected to provide stable operation.

8 Claims, 3 Drawing Figures

BROADBAND FREQUENCY MULTIPLICATION BY MULTITRANSITION OPERATION OF STEP RECOVERY DIODE

BACKGROUND OF THE INVENTION

This relates to apparatus for generating high frequency harmonic signals and, more particularly, to frequency multipliers using a semiconductor diode with a nonlinear capacitance-voltage characteristic.

Frequency multipliers, or harmonic generators, employing nonlinear semiconductor devices such as varactors or step recovery diodes are well known. For example, an impulse circuit utilizing a step recovery diode is disclosd in U.S. Pat. No. 3,374,416 to R. D. Hall et al issued Mar. 19, 1968. Frequency multipliers with step recovery diodes have proven to be superior to those with varactors particularly in applications requiring high output-frequency/input-frequency ratios also known as high order multiplication. Desirable characteristics of frequency multipliers include stability, high efficiency, broadband operation for versatility, and a smooth, pure sinusoidal output waveform.

Conventional step recovery diode frequency multipliers have provided satisfactory performance for most applications when operated at a relatively low bias mode. In this mode, the step recovery diode produces one pulse per period of the input signal by switching into a nonconductive state. In a paper entitled "Simulation of High-Order, Charge-Storage-Diode Multiplier on an Analog Computer" by P. W. C. Chilvers and K. Foster in *Electronics Letters,* Vol. 3, No. 6, June 1967, pp. 277–278, step recovery diode operation in harmonic generators is described to provide a better understanding of the operation and design criteria for these circuits.

Variation of an external dc bias to an appropriate level for the step recovery diode, as mentioned in the aforementioned paper, produced a spurious mode of operation wherein multiple transitions occurred within one period of the input signal. However, this mode of operation was also characterized as being undesirable primarily because of instability and also low efficiency. It was then pointed out that the point of best efficiency was just before the point of double transition.

It is a primary object of this invention to provide a highly stable and versatile frequency multiplier by using a step recovery diode to produce multiple transitions during each period of the exciting input signal.

It is a related object to provide a high impedance environment for the pulse generating circuitry of the step recovery diode to reflect energy back to the diode for efficient and stable operation of a high order frequency multiplier.

It is another object of this invention to provide a relatively simple circuit arrangement for a high order multiplier with minimal manufacturing and tuning adjustments.

SUMMARY OF THE INVENTION

In an illustrative embodiment of the invention, a frequency multiplier has pulse generating circuitry wherein the step recovery semiconductor diode is stably operated to produce two pulses per cycle of the alternating input signal, and has first and second filters for supplying signals to and obtaining signals from the diode. The first filter is a bandpass input filter whose passband is coextensive with the first frequency and presents a relatively high impedance for the diode at frequencies less than the first frequency. The bias circuit is a relatively high impedance circuit comprising a serial resistor connected to a parallel resistive and capacitive network for developing a self-bias potential on the diode. The second filter is a bandpass output filter whose input impedance is high from dc to the output frequency. A uniquely configured capacitor is located at the input of the diode to present thereto a relatively low impedance at frequencies greater than the first frequency while not affecting the high input impedance to the diode at lesser frequencies.

In some of the further aspects of the invention, microstrip techniques are used to provide the input filter, output filter and the uniquely configured capacitor. In particular, the bandpass filter elements are capacitively coupled resonators whose lengths correspond to fractional values of a wavelength for the frequency of the signal present.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
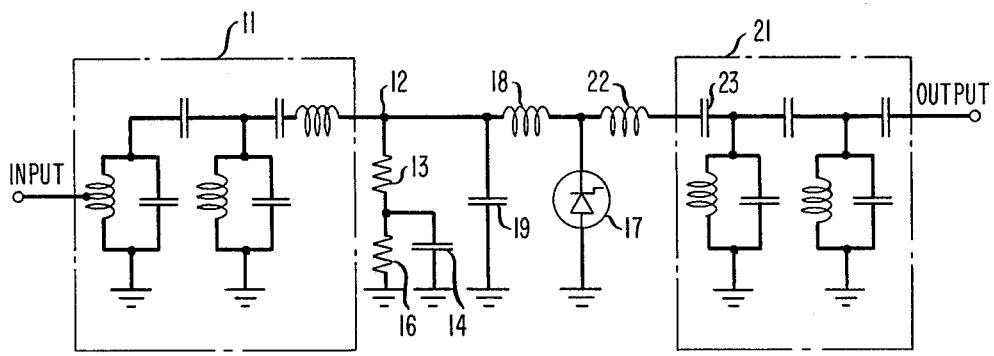
FIG. 1 is a schematic diagram of an equivalent circuit of the present frequency multiplier using lumped circuit elements.

FIG. 1 is an equivalent schematic diagram utilizing lumped reactive circuit elements for the circuit of the inventive frequency multiplier. At the outset it should be pointed out that the microwave circuit realization of the frequency multiplier uses distributed reactive circuit components as will become apparent hereinafter. At the input side of the circuit of FIG. 1, bandpass filter 11 includes two parallel resonant tank circuits capacitively coupled together and a series resonant circuit terminating at node 12. The passband of the input filter matches the frequency of the input signal. Also connected to node 12 is a self-biasing circuit which includes resistor 13 and parallel connected capacitor 14 and resistor 16. Node 12 is coupled to one terminal of step recovery diode 17 via inductor 18. One terminal of capacitor 19 is connected to ground while the other is connected to node 12.

The impedance characteristic of the circuitry to the input of diode 17 is important for the stability of the operation of the diode when it produces two pulses per period of the input signal. In particular, filter 11 serves to provide a very high input impedance to diode 17 at frequencies less than the input signal. Correspondingly, the self-biasing circuit of resistors 13 and 16 and capacitor 14 is also chosen to have a high impedance value since it shunts the output of filter 11. Capacitor 19 is a relatively small capacitor so that it has no practical effect on the input impedance characteristic of the circuit at frequencies less than that of the passband of filter 11. Another consideration in the design of filter 11 is to provide impedance transformation to prevent any undue attenuation in the level of the input signal presented to diode 17. In other words, the output impedance of the input signal source should be matched to the circuit of diode 17.

The output portion of FIG. 1 as may be observed is also a bandpass filter. However, this filter has a bandpass which corresponds to the output frequency. The output pulses from diode 17 are applied to output bandpass filter 21 via inductor 22 and capacitor 23 which form a series resonant frequency tuned to the output frequency. Although, in this case, the output frequency has a value that is six times greater than the input frequency, it should be understood that diode 17 produces pulse waveforms which are rich in harmonic content so that those skilled in the art may readily design frequency multipliers using these inventive principles to provide frequency multipliers with different factors, or orders, of multiplication. The high impedance circuitry on both the input and output sides of diode 17 serves to reflect back to the diode the undesired harmonics to maintain the efficiency and stability of the double pulse, or transition, mode of operation. Output filter 21 also performs impedance transformation so that the sinusoidal output of the frequency multiplier has a standard output impedance, e.g., 50 ohms.

Figure 2:
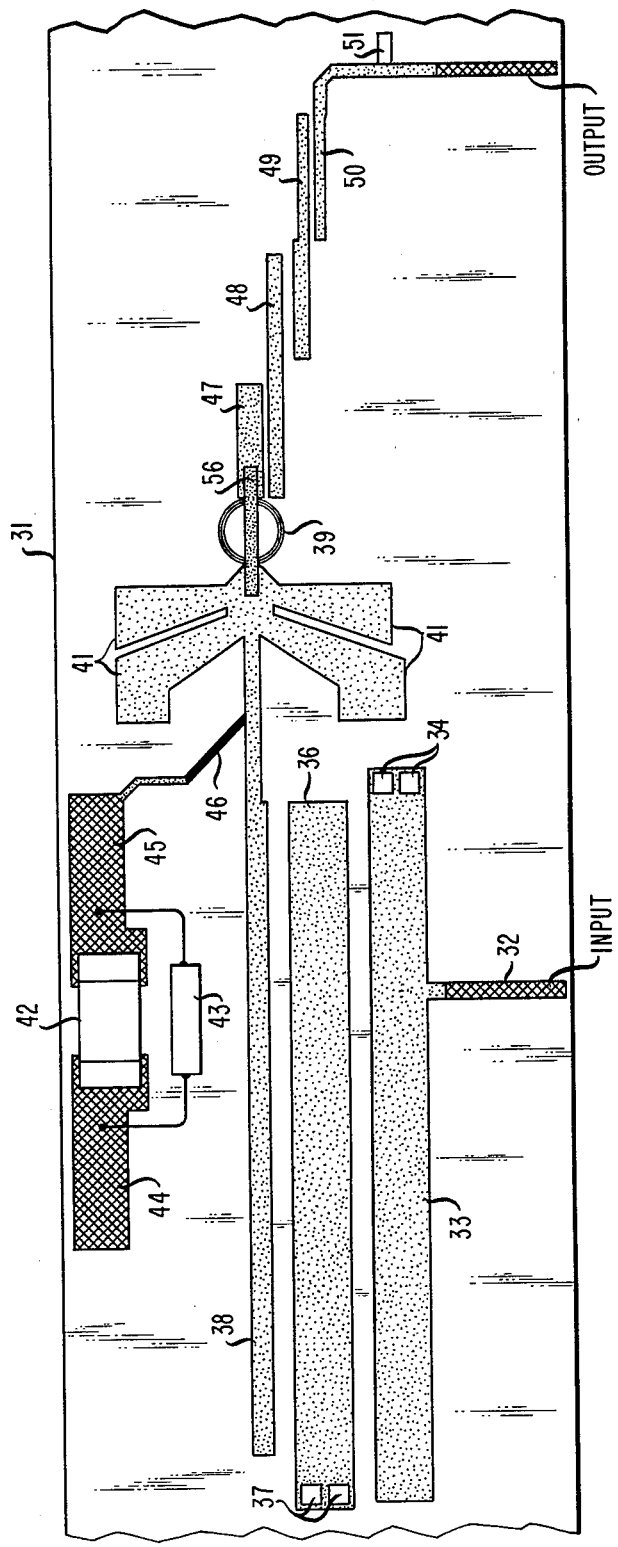
FIG. 2 depicts one arrangement for making the frequency multiplier using microstrip techniques.

FIG. 2 presents an enlarged version of a circuit layout of the frequency multiplier designed to operate with an input signal whose frequency is 1 GHz. Substrate 31 is a ceramic material suitable for supporting metallization patterns which may be generated by any one of various techniques known to those skilled in the art. The input signal is applied to cross-hatch conductor 32 which is a solder preform. Cross-hatching is used at appropriate locations in the circuitry of FIG. 2 to designate solder preform land areas. Preform 32 is connected to a quarter wavelength microstrip resonator 33 which is connected to ground, or short circuited, by plated through holes 34. It should be pointed out that resonator 33 is a microstrip microwave conductor by virtue of the fact that substrate 31 is appropriately metallized on the underside to provide a suitable ground plane. Quarter wavelength microstrip resonator 33 is represented by the first tank circuit in filter 11 of FIG. 1. In other words, the lumped reactance equivalent of resonator 33 is a parallel resonant circuit. Capacitively coupled to resonator 33 is a second resonator 36, also a quarter of a wavelength long, but grounded at the opposite end by plated through holes 37. The second tank circuit in filter 11 of FIG. 1 is the equivalent of resonator 36. The final quarter of a wavelength resonator at the input side, resonator 38, forms the third, series resonant, tank circuit of the input filter, provides impedance transformation and a signal path for driving diode 39 via radial line capacitor 41.

Radial line capacitor 41, shown as capacitor 19 in FIG. 1, serves to provide a low impedance input for diode 39 at frequencies greater than the passband of the input filter. In particular, this type of geometrical design provides better performance for the multiplier than using the more standard realization forms of this capacitor. Radial line capacitor 41 may be viewed as providing a short circuit for the unwanted harmonics generated by diode 39. Thus, the energy of these unwanted harmonics is reflected back to diode 39 rather than dissipated.

On substrate 31, the self-biasing circuit is located above resonator 38. Capacitor 42 and resistor 43 are shown attached between solder preform areas 44 and 45. Resistor 46 connects the conductive line running obliquely from solder preform area 45 to resonator 38. In the equivalent circuit of FIG. 1 capacitor 14 represents capacitor 42 and resistors 13 and 16 are respectively represented by resistors 46 and 43.

To the right of diode 39, parallel stripline resonators 47, 48, 49 provide the output filter which has a passband at a frequency six times greater than that of the filter for the input. Resonator 47 is a quarter of a wavelength long while resonators 48 and 49 are one-half wavelength long and all are serially capacitively coupled together by their mutual edges which are in close proximity. A trim tab 51 is associated with output line 50 of the multiplier. Partial removal of the metallization of tab 51 enables, should it be necessary, fine tuning of the output structure of the frequency multiplier.

For this particular design, a DVB-6109B step recovery diode available from Alpha Industries, Inc., Woburn, Mass. was used for diode 39. Substrate 31 includes a hole for housing diode 39 so that the upper terminal of the diode protrudes. After diode 39 is installed, conductive band 56 is bonded to the diode and also on either side close to the body of the diode to capacitor 41 and conductor 47.

Figure 3:
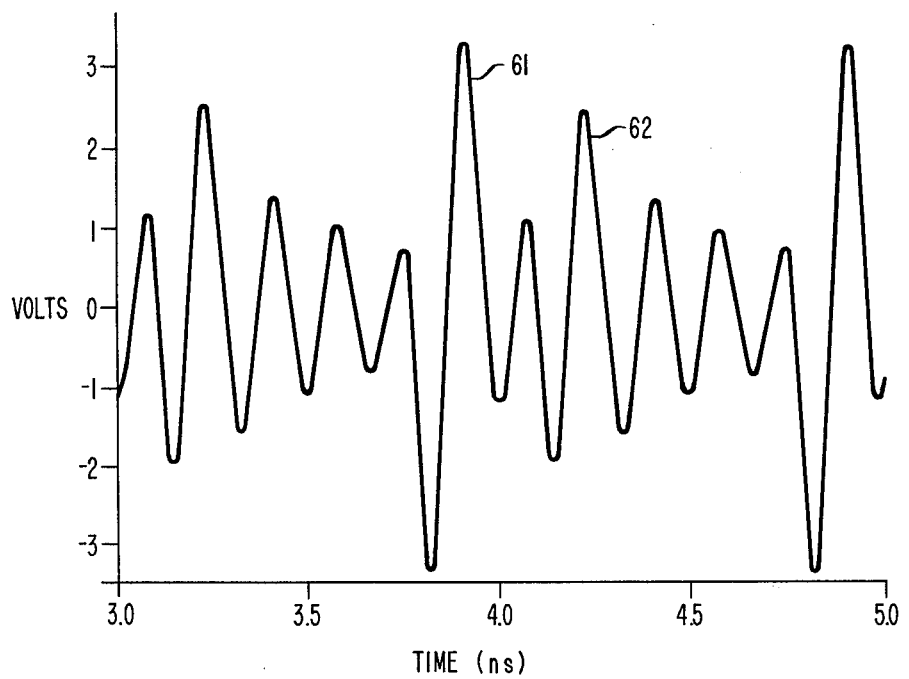
FIG. 3 is a waveform diagram for illustrating the operation of the step recovery diode.

FIG. 3 depicts the output waveform produced by diode 39 when operated in the double pulse mode. With an input frequency of 1 GHz, transitions 61 and 62 occur during each period of the input signal to produce an output signal of 6 GHz. The bias level was in the range of $-3$ to $-4$ volts on diode 39 using about a 10,000 pico-Farad value for capacitor 42 and a ten kilo-Ohm value for resistor 43. The value of resistor 46 was about one kilo-Ohm. This bias level range exceeds the lower level negative bias potential used for conventional operation of step recovery diodes. In actual practice since the diodes do vary, better performance may be obtained by matching resistive values to the particular diode being used. Performance with this circuit provided a 2 dB increase in efficiency over that provided by conventional multipliers. Furthermore, the broad band design of this arrangement allowed a frequency variation of plus or minus five percent for versatile operation. Since the spurious components are typically down about 80 dB in the output signal of the frequency multiplier, the output signal is a good sinusoidal signal of relatively high purity.

It is to be understood that the frequency multiplier described and illustrated herein is only one practical circuit realization for providing a stable circuit for multiple transition mode operation of a step recovery diode. For example, this, or similar arrangements may be used as one of the stages in frequency multipliers employing multiple stages. Furthermore, other circuit layouts may be devised by those skilled in the art while utilizing these inventive principles. Accordingly, numerous other embodiments and modifications may be made by those skilled in the art without departing from the spirit and scope of the invention.

What is claimed is:

1. A circuit responsive to a periodic, alternating signal of a first frequency from a signal source for generating a second signal at a second frequency being a multiple of the first frequency, the circuit comprising:
   first filter means, connected to receive the alternating signal, for passing the alternating signal at said first frequency to an output;
   pulse generating circuitry including a step recovery semiconductor diode connected to receive the alternating signal at the output from the first filter means and biasing means, resistively coupled to the diode to present a relatively high impedance thereto, for operating the diode at a level to produce two pulses for each periodic cycle of the alternating signal; and second filter means, connected to receive the two pulses, for providing resonance at the second frequency to supply the second signal and capable of impedance matching the pulse generating circuitry to a predetermined impedance value.

2. A circuit according to claim 1 wherein the first filter means is a bandpass input filter having a passband coextensive with the first frequency and presents a relatively high impedance characteristic for the input of the diode at frequencies less than the first frequency.

3. A circuit according to claim 2 wherein the biasing means further includes a parallel resistive and capacitive network for developing a self-bias potential.

4. A circuit responsive to an alternating current signal of a first frequency source for generating a second signal at a second frequency multiply related to the first frequency, the circuit comprising:

first filter means, connected to receive the alternating signal, for passing the alternating signal at said first frequency to an output, the first filter means comprising a bandpass input filter having a passband coextensive with the first frequency and having a relatively high output impedance characteristic at frequencies less than the first frequency:

pulse generating circuitry including a step recovery diode mounted to receive the alternating signal at the output from the first filter means and biasing means for operating the diode to produce two pulses for each cycle of the alternating signal, the biasing means presenting a relatively high impedance including a parallel resistive and capacitive network for developing a self-bias potential and the biasing means further including a resistor coupling the network to the step recovery semiconductor diode; and second filter means, connected to receive the two pulses, for providing resonance at the second frequency to supply the second signal and capable of impedance matching the pulse generating circuitry to a predetermined impedance value.

5. The circuit of claim 1 wherein the second filter means is a bandpass output filter having a passband corresponding to the second frequency and the output filter means comprises parallel and displaced conductors of lengths corresponding to fractional values of a wavelength at the second frequency and the conductors are capacitively coupled and associated to provide impedance matching.

6. The circuit of claim 5 wherein radial conductive elements are located at the input of the step recovery semiconductor diode to provide a relatively low impedance at the input of the diode at frequencies greater than the first frequency while the input filter means provides a relatively high impedance for the input of the diode at frequencies less than the first frequency.

7. The circuit of claim 6 wherein the output filter means is a bandpass filter having a relatively high impedance for the output of the diode over the band of frequencies from dc to the first frequency.

8. The circuit of claim 7 wherein the input filter means comprises capacitively coupled microstrip conductors whose lengths correspond to about a quarter of a wavelength at the first frequency.

* * * * *